United States Patent [19]

Schuster

[11] 4,453,145
[45] Jun. 5, 1984

[54] BAND PASS FILTER

[75] Inventor: Harald Schuster, Neu-Ulm, Fed. Rep. of Germany

[73] Assignee: Licentia Patent-Verwaltungs-GmbH, Frankfurt am Main, Fed. Rep. of Germany

[21] Appl. No.: 421,108

[22] Filed: Sep. 21, 1982

[30] Foreign Application Priority Data

Apr. 10, 1982 [DE] Fed. Rep. of Germany ....... 3213436

[51] Int. Cl.³ .................... H03H 7/09; H03H 7/075
[52] U.S. Cl. .................................. 333/174; 333/175; 333/176; 333/177
[58] Field of Search ............................... 333/167–171, 333/174–185, 129, 131–132

[56] References Cited

U.S. PATENT DOCUMENTS 1,850,146  3/1982  Zobel ................................... 333/167
4,369,416  1/1983  Zapp et al. .......................... 333/175

Primary Examiner—Marvin L. Nussbaum
Attorney, Agent, or Firm—Spencer & Frank

[57] ABSTRACT

A band-pass filter circuit has series elements, comprising a parallel resonant circuit and a first inductance, and shunt elements comprising a series resonant circuit and a second inductance, the resonant circuits comprising variable capacitances to permit variation of the frequency over a frequency band. The second inductance may be a transformer. The variable capacitances may be constituted by a plurality of switchable component capacitances, having switches connected between the capacitances and ground.

11 Claims, 3 Drawing Figures

BAND PASS FILTER

BACKGROUND OF THE INVENTION

The invention relates to a band pass filter and in particular to a band-pass filter. Such a band pass filter is for example known from "Frequenz", volume 15, pages 111-121. When varying such a band pass filter over a large frequency range, there is often a problem in maintaining constant the form of the filter response, which represents the characteristics of the band pass filter over the entire frequency range. It is of great interest when varying this over a wide frequency range that particularly the curve relative to the middle frequencies should be constant, that is the respective data of the filter, such as for example the respective band width of the transmission range.

SUMMARY OF THE INVENTION

The present invention provides a band-pass filter comprising series elements and shunt elements, said series elements comprising a parallel resonant circuit and first inductance means, said shunt elements comprising a series resonant circuit and second inductance means, and said resonant circuits comprising variable capacitance means whereby the frequency may be varied over a frequency band.

BRIEF DESCRIPTION OF THE DRAWINGS

Preferred embodiments of the present invention will now be described with reference to the drawings, of which.

DESCRIPTION OF THE PREFERRED EMBODIMENTS

Figure 1:
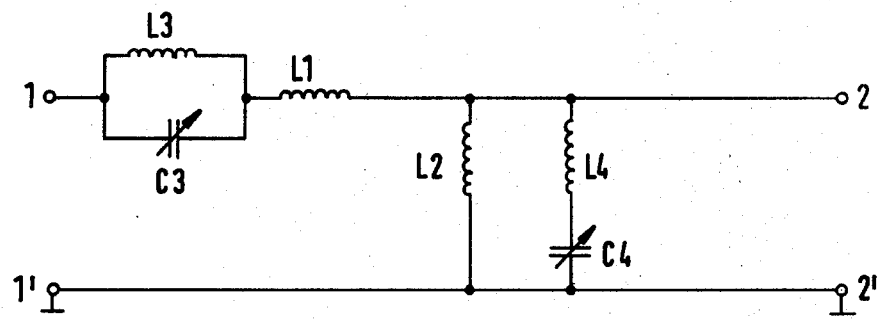
FIG. 1 shows a band pass filter in accordance with a first embodiment of the present invention.

Basically the invention seeks to solve the problem of providing at small expense a simply constructed filter which can be tuned over a wide frequency range and which maintains constant the relative frequency characteristics, in particular the respective band width.

The filter is notable for the excellent selection of characteristics despite the small number of elements required for its construction, of which only two need to be variable for changing the frequency over the frequency band. Upon simultaneous variation of the capacitances in the two resonant circuits for the purpose of setting the desired mid-frequency of the band pass filter, the relative band width and the position of the attenuation peaks relative to the middle frequency remain unaltered.

The resonant circuits are set to different side band frequencies, generally approximately symmetrical to the transmission frequency of the filter. Referring now to the drawing, the parallel circuit consisting of the inductance L3 and the capacitance C3 blocks at its resonant frequency $f_3$ and thus generates one of the attenuation peaks of the transmission peaks of the filter. The series resonant circuit L4, C4 short circuits at its resonant frequency $f_4$, and thus produces the second attenuation peak. At the middle frequency of the filter, both resonant circuits operate capacitively and form with the inductances L1 or L2 further resonant systems, the resonant frequency of which is equal to and thus forms the middle frequency $f_0$ of the transmission range of the filter. The capacitances C3 and C4 are variable according to the magnitude of the desired filter middle frequency. Since on tuning through the range, two resonant elements, on the one hand L2, L4, C4 and on the other hand L1,L3,C3, have to be tuned to the same frequency, then the variations of the capacitances C3 and C4 must be simultaneous and in the same relationship. It can be shown that thereby the relative positions of the different resonant frequencies (attenuation peaks, transmission zone) is independent of the capacitances and is determined only by the relationship of the inductances.

Tuning of the capacitances is, according to an advantageous form, possible in steps. During tuning the relative step widths for C3 and C4, as shown, is selected to be of equal size. In an advantageous form, the capacitances for this purpose are arranged as several switchable partial capacitances, stepped in a binary manner. The setting of the capacitances can then advantageously be acheved by a computing device using the same binary word.

Advantageously, the series elements are arranged prior to the shunt arms in the input circuit (1, 1'). This avoids loading the input side with a short circuit upon resonance of the series circuits L4, C4. If, as in a further useful form of the invention, the inductance L1 is large relative to the other inductances, this ensures that the band pass filter shows a high input impedance over a wide range in the low frequency part of the blocking range. By this means it is possible with advantage to connect a number of band pass filters tuned to different transmission frequencies to the same source.

Figure 2:
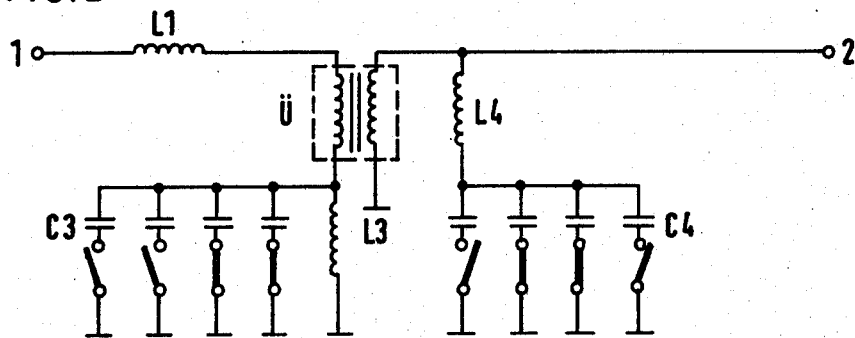
FIG. 2 shows a band pass filter in accordance with a second embodiment of the present invention.
Figure 3:
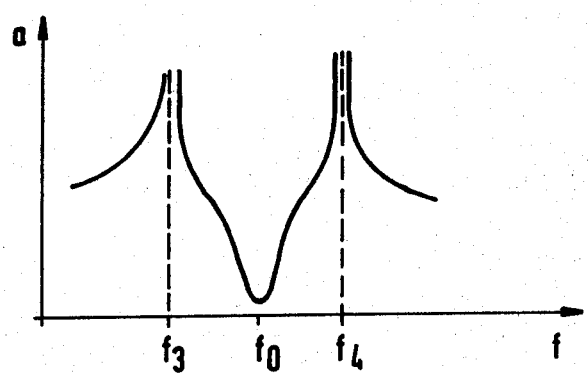
FIG. 3 shows the attenuation curve of a filter in accordance with the present invention.

It can be a disadvantage with a filter as shown in FIG. 1, when using variable capacitances C3 consisting of a number of switchable partial capacitances, if the switching means then necessary lies at a potential above ground. The switching means can provide disturbing capacitances relative to ground which additionally vary upon switching of the partial capacitances and thus adversely effect the eveness of the capacitance switching stages. These disadvantages can be avoided in a particularly advantageous embodiment of the invention as shown in FIG. 2.

The second inductance, which is arranged as a shunt arm in the circuit is formed in this embodiment by a transformer U. Both windings of the transformer can be separately connected with ground. Thus the input circuit and the output circuit of the filter are decoupled. Members connected in series in each of the circuits can then be arranged within the circuits in any desired sequence.

The parallel resonant circuit L3, C3 can in this case be connected between the primary winding of the transformer and ground, without thereby altering the electrical characteristics of the filter. Thus the partial capacitances C3 are connected on one side to ground. The switching means for switching the partial capacitances are preferably then so arranged that, independent of their switching state, they are connected to ground and thus do not form disturbing capacitances relative to the housing connected also to ground.

It will be understood that the above description of the present invention is susceptible to various modifications changes and adaptations.

What is claimed is:

1. A band-pass filter comprising series elements and shunt elements, said series elements comprising a parallel resonant circuit and a first inductance means, said shunt elements comprising a series resonant circuit and a second inductance means, and said resonant circuits comprising variable capacitance means, whereby the frequency may be varied over a frequency band.

2. A band-pass filter as claimed in claim 1, said variable capacitance means being settable in a stepwise manner.

3. A band-pass filter as claimed in claim 2, said variable capacitance comprising a plurality of switchable component capacitances.

4. A band-pass filter as claimed in claim 3, said component capacitances being stepped in binary manner.

5. A band-pass filter as claimed in claim 1 and comprising an input and an output, said series elements being arranged between said input and said shunt elements.

6. A band-pass filter as claimed in claim 5, said parallel resonant circuit comprising third inductance means and said series resonant circuit comprising fourth inductance means, the value of said first inductance means being large relative to the values of the other inductance means.

7. A band-pass filter arrangement comprising a plurality of band-pass filter as claimed in claim 6 connected to a single source.

8. A band-pass filter as claimed in claim 1, said second inductance means being constituted by a transformer.

9. A band-pass filter as claimed claim 8, said transformer having a primary winding and a secondary winding, each of said windings having a respective terminal coupled to ground.

10. A band-pass filter as claimed in claim 9, said parallel resonant circuit being connected between said primary winding and ground.

11. A band-pass filter as claimed in claim 10, the variable capacitance means of said parallel resonant circuit comprising a plurality of component capacitances, and having switching means for switching said component capacitances, said switching means being arranged between said component capacitances and ground.

* * * * *